United States Patent
Chen et al.

(10) Patent No.: US 11,363,739 B2
(45) Date of Patent: Jun. 14, 2022

(54) LIQUID COOLING HEAD DEVICE

(71) Applicant: Auras Technology Co., Ltd., New Taipei (TW)

(72) Inventors: Chien-Yu Chen, New Taipei (TW); Tian-Li Ye, New Taipei (TW); Jen-Hao Lin, New Taipei (TW); Chien-An Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/197,727

(22) Filed: Mar. 10, 2021

(65) Prior Publication Data

US 2021/0307197 A1 Sep. 30, 2021

Related U.S. Application Data (60) Provisional application No. 63/000,511, filed on Mar. 27, 2020.

(30) Foreign Application Priority Data

Dec. 11, 2020 (TW) ................................ 109143964

(51) Int. Cl.
*H05K 7/20* (2006.01)
*H02K 7/14* (2006.01)

(52) U.S. Cl.
CPC ........... *H05K 7/20272* (2013.01); *H02K 7/14* (2013.01); *H05K 7/20254* (2013.01)

(58) Field of Classification Search
CPC ........... H05K 7/20272; H05K 7/20772; H05K 7/20254; H05K 7/20763; H02K 7/14; H02K 5/203; H02K 9/19; H02K 9/06; H02K 5/20; H02K 5/18

See application file for complete search history.

(56) References Cited

U.S. PATENT DOCUMENTS

2006/0275151 A1 * 12/2006 Heins ................. F04D 29/5866
 417/313
2009/0225534 A1 * 9/2009 Thomas ................. F21V 29/80
 362/373

(Continued)

OTHER PUBLICATIONS

U.S. Appl. No. 17/125,540, filed Dec. 17, 2020.

*Primary Examiner* — Adam B Dravininkas
(74) *Attorney, Agent, or Firm* — Muncy, Geissler, Olds & Lowe, P.C.

(57) ABSTRACT

A liquid cooling head device includes a base, a cover covering the base, an inlet portion disposed on the base, an outlet portion formed on the cover, and a fluid pump having a housing and a fan blade. The base includes a diversion channel, an opening and a first chamber connected to the diversion channel and the opening. A second chamber is formed between the cover and the base, and connected to the first chamber through the opening. The inlet portion is connected to the first chamber through the diversion channel. The housing covers one surface of the cover, so that a third chamber is collectively defined by the housing and the cover, and connected with the second chamber and the outlet portion. The fan blade is located in the third chamber, and the diversion channel is located between the fan blade and the first chamber.

10 Claims, 7 Drawing Sheets

(56) References Cited

U.S. PATENT DOCUMENTS

| | | | |
|---|---|---|---|
| 2014/0219848 A1* | 8/2014 | Rabhi | F04C 2/04 418/24 |
| 2014/0334921 A1* | 11/2014 | Park | F04D 13/0606 415/175 |
| 2016/0216048 A1* | 7/2016 | Tsai | F28F 3/02 |
| 2017/0192471 A1* | 7/2017 | Tsai | G06F 1/20 |
| 2017/0212560 A1* | 7/2017 | Tsai | G06F 1/20 |
| 2019/0053403 A1* | 2/2019 | Lin | H01L 23/427 |
| 2019/0239388 A1* | 8/2019 | Tsai | H01L 23/473 |
| 2019/0317577 A1* | 10/2019 | Lin | H05K 7/20281 |

* cited by examiner

LIQUID COOLING HEAD DEVICE

RELATED APPLICATIONS

This application claims priority to U.S. Provisional Application Ser. No. 63/000,511, filed Mar. 27, 2020, and Taiwanese Application Serial Number 109143964 filed Dec. 11, 2020, which are herein incorporated by reference.

BACKGROUND

Field of Disclosure

The present disclosure relates to a heat dissipation module. More particularly, the present disclosure relates to a liquid cooling head device.

Description of Related Art

With increasing development of science technology, various electrical devices (e.g., notebook computers, desktop computers and network servers etc.) have become indispensable roles in the daily lives of people. Generally, during the operation of the electrical components arranged inside these products, temperatures thereof will be gradually increased, and high temperatures may easily damage the electrical components. Therefore, a heat dissipation mechanism is a very important and necessary design for each of these electronic products. One of conventional heat dissipating mechanisms normally is practiced with a fan that is used to produce airflow to cool the electrical component through convection, or a heat dissipating unit with special material that is attached on the electrical component to thermally dissipate and conduct. Also, a water-cooling heat dissipation mechanism is another effective and common one of the conventional heat dissipating mechanisms.

Generally speaking, the principle of the liquid cooling heat dissipation mechanism is to perform a continuous thermal-dissipating circulation in an operation system using liquid (e.g. water or coolant) as a heat dissipation medium by continuously operating pumps. The liquid can flow in closed pipelines, and these closed pipelines are distributed on the surface of the electrical components (e.g., central processing unit) in the operation system. When liquid with relatively low temperature flows over the electrical components with relatively high temperature, the liquid absorbs heat energy to slow down the elevation of the temperature. Next, the heat energy of the liquid can be thermally exchanged by exterior or other heat dissipating mechanism through the closed pipeline for decreasing the temperature.

However, because the internal space of general computer equipment, host or server equipment is not much, it can only be practiced in the original space of the environment. Furthermore, the liquid cooling heat dissipation mechanism must be installed with pipeline having inflow and outflow design, which makes the installation of the pipeline relatively complicated. Therefore, there is a need to design a liquid cooling heat dissipation module with enhanced heat-dissipating efficacy for achieving the main purpose of development, that is able to collectively allocate overall pipeline configuration, reduce the occupied space of the piping system to arrange the construction in a narrow environment, and effectively complete the connection with other pipelines to avoid water leakage.

SUMMARY

One aspect of the present disclosure is to provide a liquid cooling head device to solve the aforementioned problems of the prior art.

In one embodiment of the present disclosure, a liquid cooling head device is provided, and includes a base, a heat-dissipation fin module, an upper cover, an inlet portion, an outlet portion and a fluid pump. The base includes a diversion channel, a first chamber and at least one opening. The first chamber is in communication with the diversion channel and the opening. The heat-dissipation fin module is received within the first chamber. The upper cover covers one surface of the base, and a second chamber is formed between the upper cover and the base, and is in communication with the first chamber through the at least one opening. The inlet portion is disposed on the base, and is in communication with the first chamber through the diversion channel. The outlet portion is formed on the upper cover. The fluid pump includes a housing and a fan blade. The housing covers one surface of the upper cover facing away from the base, so that a third chamber is collectively defined by the housing and the upper cover, and the third chamber is respectively connected with the second chamber and the outlet portion. The fan blade is located in the third chamber, and the diversion channel is located between the fan blade and the first chamber. Thus, when a working fluid is sent into the first chamber from the inlet portion, and further flowed into the second chamber, the fan blade draws the working fluid in the second chamber out of the outlet portion through the third chamber.

According to one or more embodiments of the present disclosure, in the liquid cooling head device, the base includes a thermally conductive plate, a lower cover and an elastic deflecting cover. The heat-dissipation fin module is disposed one surface of the thermally conductive plate. The lower cover is assembled to the thermally conductive plate. The elastic deflecting cover is sandwiched between the thermally conductive plate and the lower cover. The elastic deflecting cover includes a first through hole and at least one second through hole. The first through hole is in communication with the diversion channel and the first chamber. The second through hole is in communication with the opening and the first chamber.

According to one or more embodiments of the present disclosure, in the liquid cooling head device, the opening and the second through hole are two in number, and the openings are respectively aligned with, and communicated with the second through holes. The first through hole is located between the second through holes and arranged at a central position of the lower cover.

According to one or more embodiments of the present disclosure, in the liquid cooling head device, the housing includes a machine chamber and a lower recess. The lower recess is formed on one surface of the housing, and the machine chamber is disposed in an interior of the housing. The upper cover is formed with an upper recess. The third chamber is collectively formed by the upper recess and the lower recess, and the third chamber and the machine chamber are hermetically isolated to each other.

According to one or more embodiments of the present disclosure, in the liquid cooling head device, the fluid pump further includes a stator, a rotor, a shaft rod and a circuit board. The stator is located in the machine chamber. The rotor is located in the third chamber, and fixedly connected to the fan blade. The shaft rod passes through the rotor and the fan blade, and connected to the upper cover. The circuit board is used to drive the rotor to rotate the fan blade.

According to one or more embodiments of the present disclosure, in the liquid cooling head device, the rotor is a magnet, and the stator is one of a silicon steel sheet, a magnet and an electromagnet.

According to one or more embodiments of the present disclosure, in the liquid cooling head device, the heat-dissipation fin module includes a plurality of fin portions, and a slit is formed between any two adjacent ones of the fin portions. The elastic deflecting cover includes a flexible pad and a plurality of positioning blocks, and the positioning blocks are spaced arranged on one surface of the flexible pad facing towards the thermally conductive plate, and the positioning blocks respectively insert into the slits for fixing the elastic deflecting cover on the thermally conductive plate.

According to one or more embodiments of the present disclosure, in the liquid cooling head device, one surface of the lower cover facing away from the elastic deflecting cover is formed with a sunken portion. The opening is formed within the sunken portion, and one surface of the lower cover facing towards the elastic deflecting cover is formed with at least one annular concave portion surrounding the opening.

According to one or more embodiments of the present disclosure, in the liquid cooling head device, the elastic deflecting cover further includes at least one annular protruding portion protrusively provided on one surface of the flexible pad facing away from the thermally conductive plate, and inserting into the annular concave portion.

According to one or more embodiments of the present disclosure, in the liquid cooling head device, the elastic deflecting cover includes a flexible material.

Thus, through the construction of the embodiments above, In addition to achieving good heat dissipation efficiency, the present disclosure is also beneficial to be applied to related computer equipment, host or server equipment.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 1A:
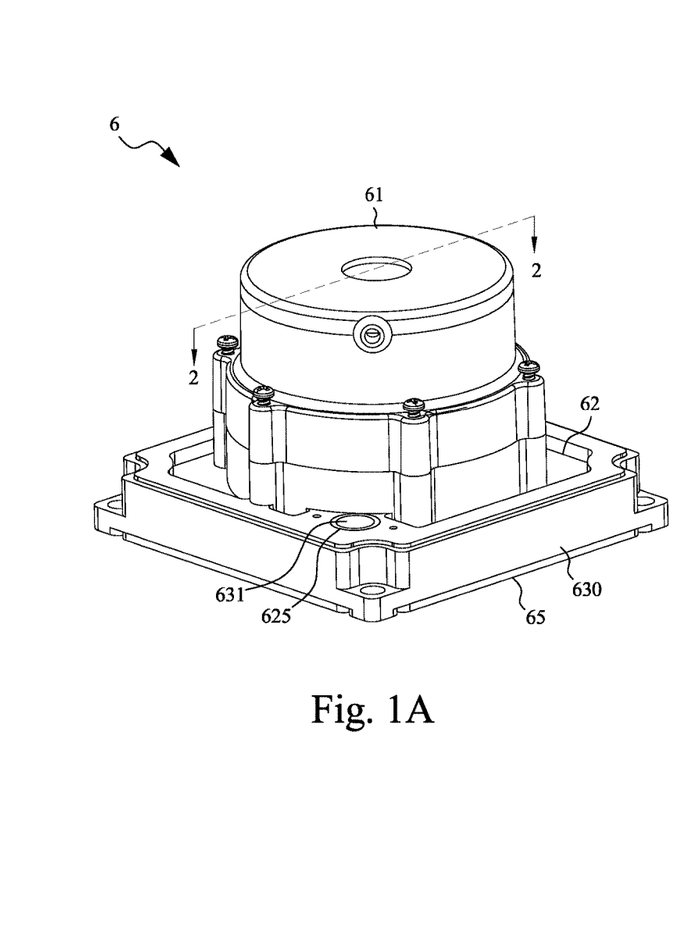
FIG. 1A is a perspective view of a liquid cooling head device according to one embodiment of the present disclosure.
Figure 1B:
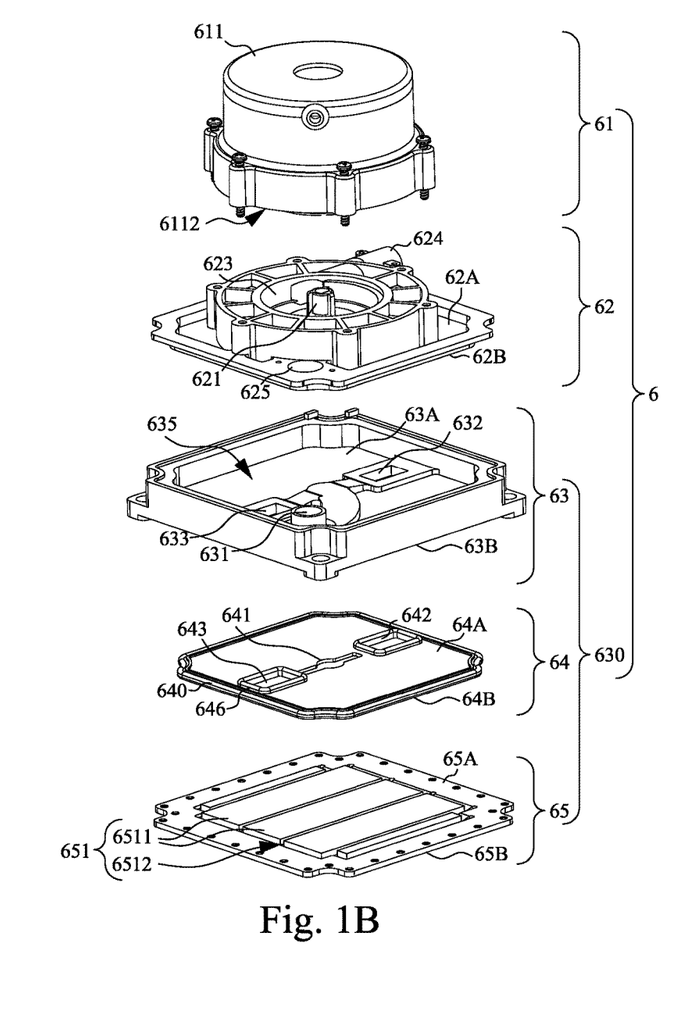
FIG. 1B is an exploded view of the liquid cooling head module.
Figure 2:
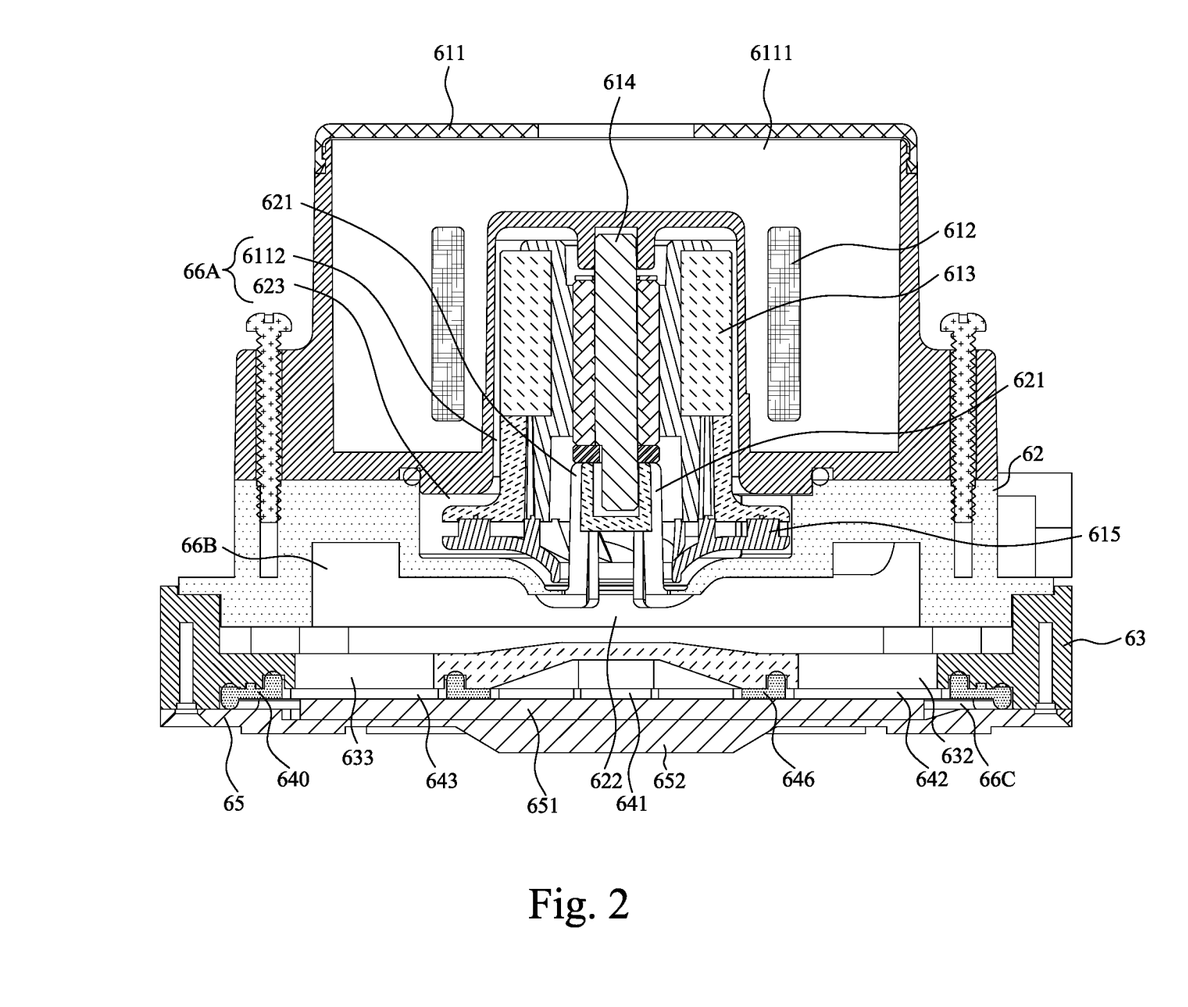
FIG. 2 is a cross-sectional view of the liquid cooling head module taken along a line 2-2 shown in FIG. 1A.

Reference is now made to FIG. 1A to FIG. 2, in which FIG. 1A is a perspective view of a liquid cooling head device 6 according to one embodiment of the present disclosure, FIG. 1B is an exploded view of the liquid cooling head device 6, and FIG. 2 is a cross-sectional view of the liquid cooling head device 6 taken along a line 2-2 shown in FIG. 1A.

As shown in FIG. 1A, FIG. 1B to FIG. 2, the liquid cooling head device 6 mainly includes a fluid pump 61, an upper cover 62 and a base 630. The fluid pump 61, the upper cover 62 and the base 630 are stacked together from the top to the bottom for assembling the liquid cooling head device 6. The base 630 includes a diversion channel 634, a first chamber 66C and two openings 632, 633. A heat-dissipation fin module 651 is disposed within the first chamber 66C. The upper cover 62 includes a first side 62A and a second side 62B which are opposite to each other. The second side 62B of the upper cover 62 covers the top surface of the base 630. The second chamber 66B is in communication with the first chamber 66C through the openings 632, 633. The base 630 is formed with an inlet portion 631, and the inlet portion 631 is in communication with the first chamber 66C through the diversion channel 634. The first side 62A of the upper cover 62 is formed with an outlet portion 624. The fluid pump 61 covers the upper cover 62 so that a third chamber 66A is collectively defined by the fluid pump 61 and the upper cover 62.

More specifically, the base 630 includes a lower cover 63, an elastic deflecting cover 64 and a thermally conductive plate 65. The thermally conductive plate 65 includes a first side 65A and a second side 65B which are opposite to each other. The heat-dissipation fin module 651 is disposed at the first side 65A of the thermally conductive plate 65. The lower cover 63 includes a first side 63A and a second side 63B which are opposite to each other. The second side 63B of the lower cover 63 is assembled to the thermally conductive plate 65. The inlet portion 631 and the openings 632, 633 are formed on the lower cover 63 to be penetrated through the first side 63A and the second side 63B, respectively. The elastic deflecting cover 64 is sandwiched between the first side 65A of the thermally conductive plate 65 and the second side 63B of the lower cover 63.

The elastic deflecting cover 64 includes a flexible pad 640, a first through hole 641 and two second through holes 642, 643. The flexible pad 640 includes a first side 64A and a second side 64B which are opposite to each other. The first through hole 641 and the second through holes 642, 643 are formed on the flexible pad 640 to be penetrated through the first side 64A and the second side 64B, respectively. The first through hole 641 is in communication with the diversion channel 634 and the first chamber 66C, and the second through holes 642, 643 are aligned and communicated with the openings 632, 633. On the other hand, the second through holes 642, 643 are also in communication with the first chamber 66C. In this embodiment, but not limited to thereto, the first through hole 641 is located between the second through holes 642, 643 and approximately positioned at a center of the lower cover 63. Furthermore, the elastic deflecting cover 64 further includes a plurality of the positioning blocks 645 and two annular protruding portions 646. The annular protruding portions 646 are spaced arranged on the second side 64B of the flexible pad 640. Each of the annular protruding portions 646 is protrusively provided on one surface of the flexible pad 640 facing away from the thermally conductive plate 65 (that is, the second side 64B of the flexible pad 640), and surrounds the second through holes 642, 643.

The fluid pump 61 further includes a housing 611, a stator 612, a circuit board (not shown in figures), a rotor 613, a shaft rod 614 and a fan blade 615. The housing 611 covers one surface of the upper cover 62 facing away from the base 630 so that the third chamber 66A aforementioned above is formed between the housing 611 and the upper cover 62. The third chamber 66A is in communication with the second chamber 66B and the outlet portion 624, respectively. The housing 611 includes a machine chamber 6111 that is a space being isolated from the working fluid, and containing the circuit board and the stator 612 therein. The stator 612 is a magnetic element such as a silicon steel sheet, a magnet or an electromagnet, and electrically connected to the circuit board. The rotor 613 is assembled to the fan blade 615 together, the rotor 613 is located within a working space that the working fluid may pass by (i.e., outside the machine chamber 6111). The rotor 613 uses a magnetic element, such as a magnet. The upper cover 62 is formed with a upper recess 623. The fan blade 615 is located within the upper recess 623 of the upper cover 62, and the diversion channel 634 is disposed between the fan blade 615 and the first chamber 66C. Under the cooperatively action of the circuit board, the stator 612 and the rotor 613, the fan blade 615 can be driven to rotate, thereby guiding the flowing of the working fluid. Also, the shaft rod 614 inserts through the rotor 613 and the fan blade 615, and is installed on a shaft holder 621 of the upper cover 62 to prevent the rotor 613 and the fan blade 615 from swinging or deviating from the rotation axis when rotating. The upper cover 62 and the housing 611 of the fluid pump 61 are assembled together for collectively defining the aforementioned third chamber 66A. The second sides 62B of the upper cover 62 faces towards the lower cover 63, and can be assembled to the first side 63A of the lower cover 63 together. In the embodiment, a screwedly fixing method is used for the assembling technology thereof, and two different components are assembled together by corresponding screw holes and screws. More specifically, one surface of the housing 611 is formed with a lower recess 6112. The upper recess 623 and the lower recess 6112 are collectively formed the aforementioned third chamber 66A.

Also, the upper cover 62 is formed with a shaft holder 621 at the first side 62A of the upper cover 62, and at least one piercing hole 622 is formed below the bottom of the shaft holder 621. Furthermore, the upper cover 62 is formed with the upper recess 623 and the outlet portion 624 (e.g., drain pipeline) around the shaft holder 621. The upper recess 623 is a part of the third chamber 66A, and corresponds to the bottom of the fan blade 615 in size, so that the bottom of the fan blade 615 can be received therein. The outlet portion 624 is in communication with the upper recess 623 to discharge the working fluid outside the liquid cooling head device 6 from the upper recess 623.

The first side 63A of the lower cover 63 corresponds to the second side 62B of the upper cover 62 so that the lower cover 63 and the upper cover 62 are assembled together to define the aforementioned second chamber 66B that is in communication with the aforementioned third chamber 66A through the piercing hole 622. The second side 63B of the lower cover 63 faces towards the elastic deflecting cover 64 and the thermally conductive plate 65. The second side 63B of the lower cover 63 and the first side 65A of the thermally conductive plate 65 are assembled to each other, and the elastic deflecting cover 64 is sandwiched between the lower cover 63 and the thermally conductive plate 65. Also, the aforementioned first chamber 66C is collectively defined by the elastic deflecting cover 64 and the thermally conductive plate 65. The elastic deflecting cover 64 can guide the flow of the working fluid, and the elastic deflecting cover 64 can be made of flexible and deformable rubber material, so that the elastic deflecting cover 64 can be a waterproof gasket and an O-ring (O-ring) at the same time. The elastic deflecting cover 64 not only can fill the gap between the lower cover 63 and the thermally conductive plate 65, but also prevent from the leakage of working fluid.

The opening 632 of the lower cover 63 is directly corresponded to one of the second through holes 642 of the elastic deflecting cover 64 along the vertical direction. The another opening 633 of the lower cover 63 is directly corresponded to another second through hole 643 of the elastic deflecting cover 64 along the vertical direction. One surface (i.e., the first side 63A) of the lower cover 63 facing away from the elastic deflecting cover 64 is formed with a sunken portion 635, and the openings 632 are formed within the sunken portion 635. One surface (i.e., the second side 63B) of the lower cover 63 facing towards the thermally conductive plate 65 is formed with two annular concave portions 636. Each of the annular concave portions 636 surrounds one of the openings 632, and each of the annular protruding portions 646 inserts into one of the annular concave portions 636. Furthermore, the second side 63B of the lower cover 63 is formed with the aforementioned diversion channel 634 (please also refer to FIG. 2B), and the aforementioned diversion channel 634 is in communication with the inlet portion 631 of the lower cover 63 and the first through hole 641 of the elastic deflecting cover 64 after the lower cover 63, the elastic deflecting cover 64 and the thermally conductive plate 65 are finished assembling together. Conversely, when the elastic deflecting cover 64 is removed away from the lower cover 63, the annular protruding portions 646 are drawn away from the corresponding annular concave portions 636, respectively.

The aforementioned heat-dissipation fin module 651 is formed on the first side 65A of the thermally conductive plate 65. The aforementioned heat-dissipation fin module 651 includes a plurality of fin portions 6511. Each of the fin portions 6511 includes a plurality of fins arranged abreast thereon (omitted in the figures). A slit 6512 is formed between any two adjacent ones of the fin portions 6511. When the elastic deflecting cover 64 covers the first side 65A of the thermally conductive plate 65, each of the positioning blocks 645 of the elastic deflecting cover 64 extends into one of the slits 6512 for fixing the elastic deflecting cover 64 on the thermally conductive plate 65, and directing the working fluid into the fin portions 6511 so that the fins can take away the heat absorbed by the working fluid. It is noted, the aforementioned third chamber 66A jointly defined by the elastic deflecting cover 64 and the thermally conductive plate 65 is fully filled by most of the aforementioned heat-dissipation fin module 651 and the slits 6512.

The second side 65B of the thermally conductive plate 65 can be provided with a protruding platform structure 652 protruding formed outwardly. The protruding platform structure 652 is used for thermally contacting with a heat source directly, or thermally contacting with the heat source indirectly by a thermal paste or a thermal pad. Next, the liquid cooling head device of the disclosure will be described, and the flow direction of the working fluid inside the liquid cooling head device is also shown correspondingly to the corresponding structures of each component of the liquid cooling head device.

Figure 3A:
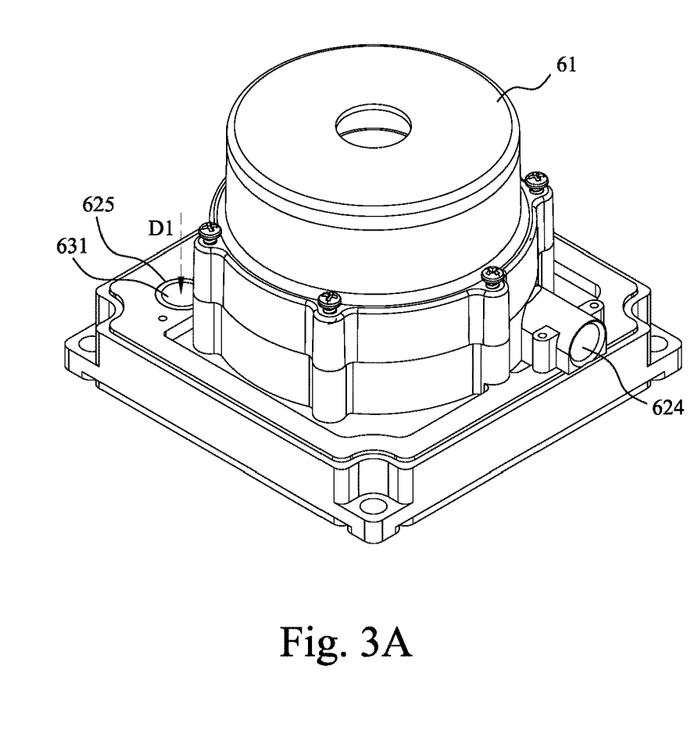
FIG. 3A and FIG. 3B are three-dimensional partial views of the liquid cooling head device showing the process of the working fluid flowing to a diversion channel of a lower cover from the outside.
Figure 3B:
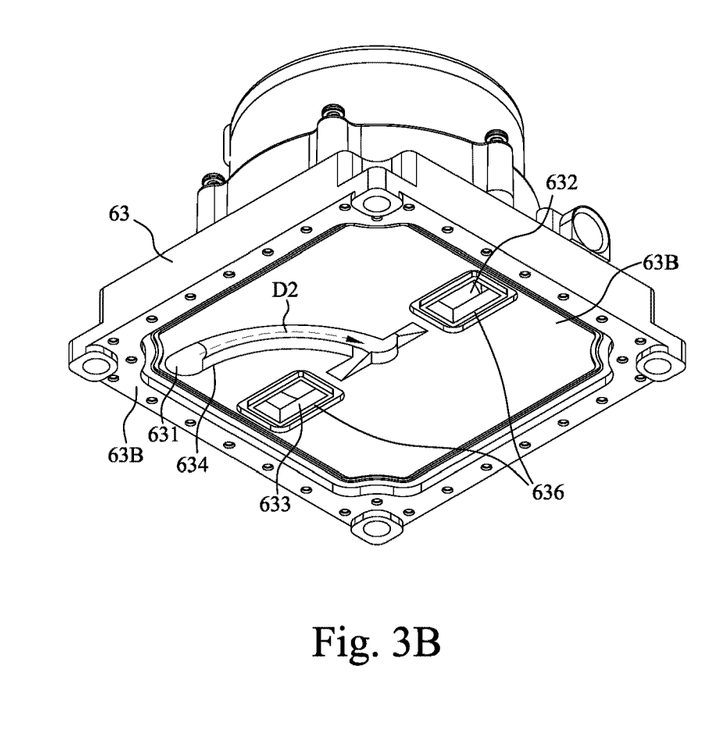

FIG. 3A and FIG. 3B are three-dimensional partial views of the liquid cooling head device 6 (merely including the fluid pump 61, the upper cover 62 and the lower cover 63), showing the process of the working fluid flowing to the diversion channel 634 of the lower cover 63 from the outside. Firstly, please refer to FIG. 3A, the working fluid flows into the liquid cooling head device 6 from an opening 625 of the upper cover 62 through the inlet portion 631 of the lower cover 63 in a direction D1. Next, as shown in FIG. 3B, the working fluid flows to the central position of the second side 63B of the lower cover 63, that is located above the first through hole 641 of the elastic deflecting cover 64 (FIG. 1B) along the diversion channel 634 having an arc-shaped outline in a direction D2.

Figure 4A:
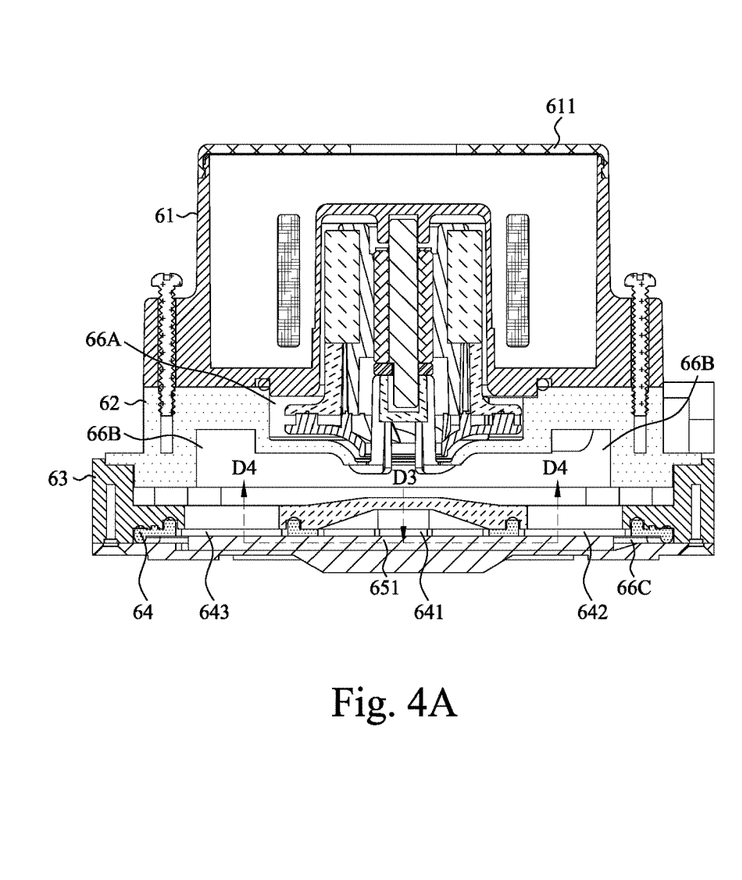
FIG. 4A and FIG. 4B are a sectional view and a three-dimensional partial view of the liquid cooling head device, which separately show the process of the working fluid flowing into a second chamber through a third chamber after flowing through an elastic deflecting cover from the lower cover.
Figure 4B:
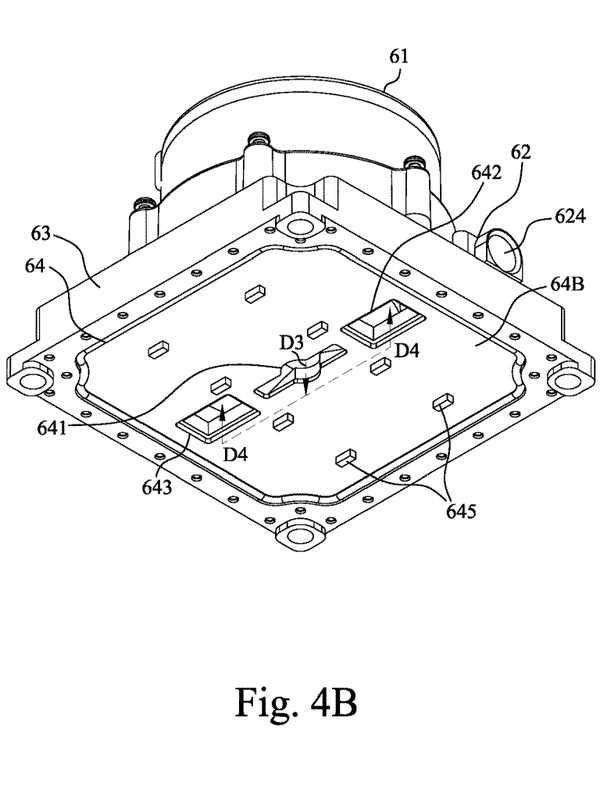
Figure 4C:
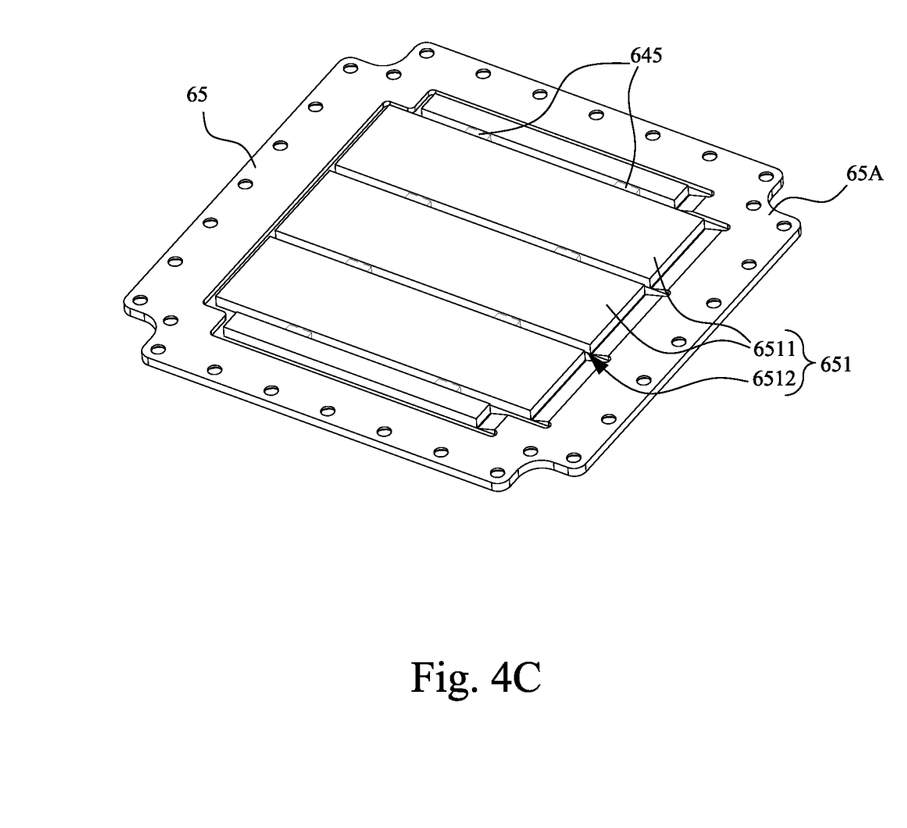
FIG. 4C is a perspective view of a thermally conductive plate of the liquid cooling head device.

FIG. 4A and FIG. 4B are a sectional view and a three-dimensional partial view of the liquid cooling head device 6 (merely including the fluid pump 61, the upper cover 62, the lower cover 63 and the elastic deflecting cover 64), which separately show the process of the working fluid flowing into a second chamber 66B through a third chamber 66A after flowing through the elastic deflecting cover 64 from the lower cover 63. FIG. 4C is a perspective view of a thermally conductive plate 65 of the liquid cooling head device 6, in which the positioning blocks 645 inserted within the slits 6512 can be represented as dotted lines. As shown in FIG. 4A to FIG. 4C, after the working fluid passes through the first through hole 641 of the elastic deflecting cover 64, the working fluid goes downwardly into the first chamber 66C in the direction D3; thereafter, the working fluid flows to gather within the second through holes 642, 643 of the elastic deflecting cover 64 and ready to flow upwardly into the second chamber 66B after the working fluid flows through the slits 6512 between the fin portions 6511 in the direction D4 (FIG. 4A and FIG. 4B).

Figure 5A:
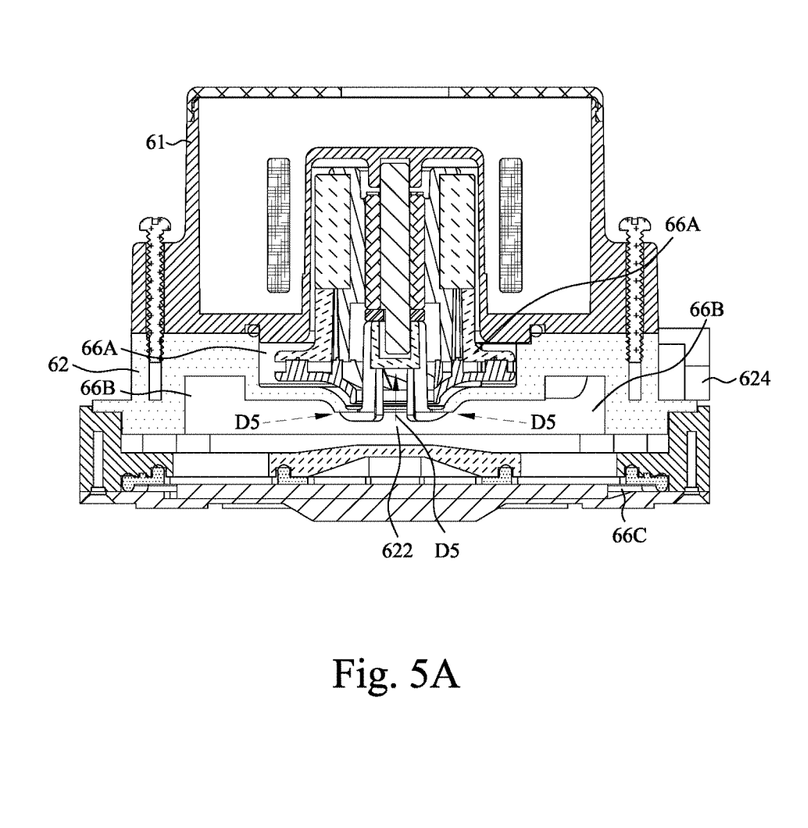
FIG. 5A and FIG. 5B are a sectional view and a three-dimensional partial view of a liquid cooling head device, which separately show the process of the working fluid converging into a third chamber after flowing into the second chamber.
Figure 5B:
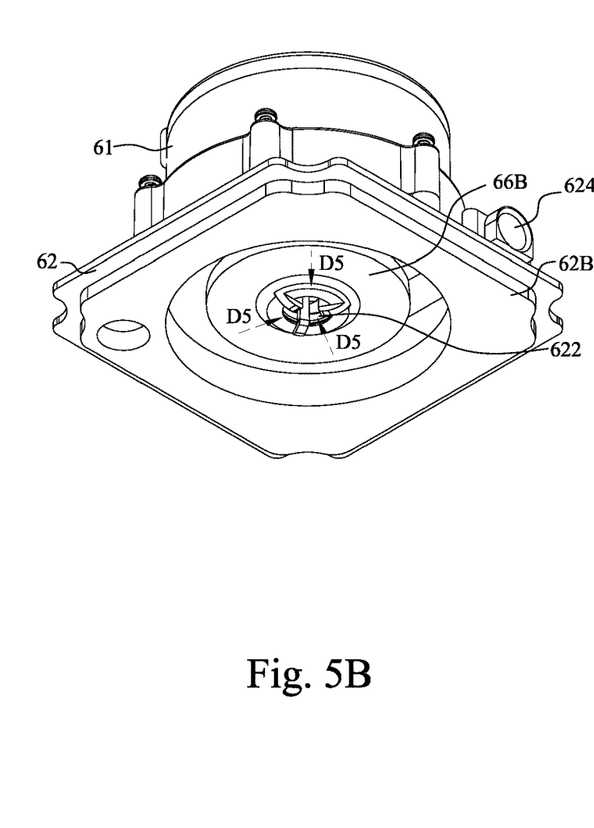

FIG. 5A and FIG. 5B are a sectional view and a three-dimensional partial view of a liquid cooling head device 6 (merely including the fluid pump 61 and the upper cover 62), which separately show the process of the working fluid converging into the third chamber 66A after flowing into the second chamber 66B. As shown in FIG. 5A to FIG. 5B, after the working fluid passes through the second through holes 642, 643 of the elastic deflecting cover 64, the working fluid can pass through the openings 632, 633 of the lower cover 63 and then enter the second chamber 66B. At this time, after the working fluid is rearranged in the second chamber 66B, the working fluid can converge at the piercing hole 622 of the upper cover 62 in the direction D5 and ready to enter the third chamber 66A.

Figure 6A:
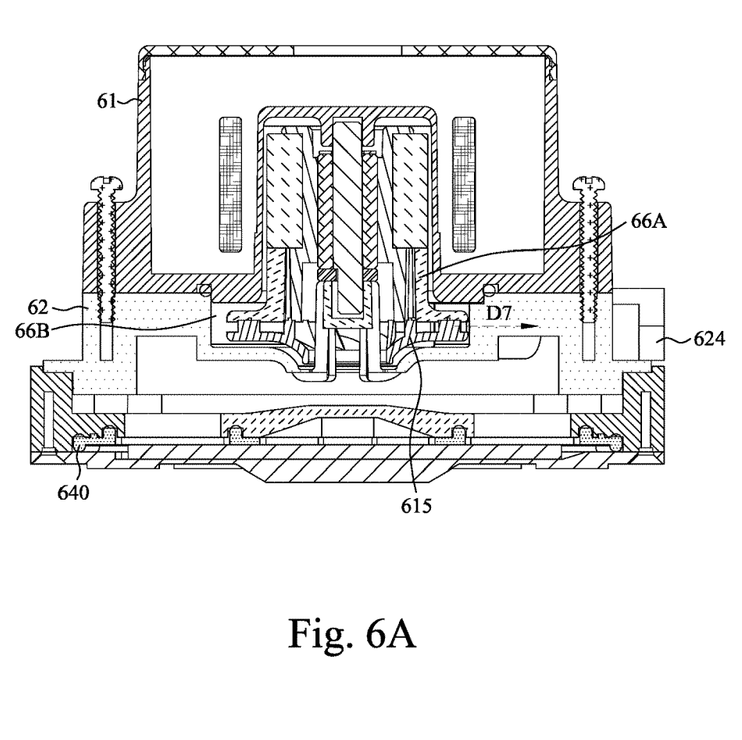
FIG. 6A and FIG. 6B are a sectional view and a three-dimensional partial view of a liquid cooling head device, which separately show the process of the working fluid finally discharged from the liquid cooling head device by the fan blade after flowing into the third chamber.
Figure 6B:
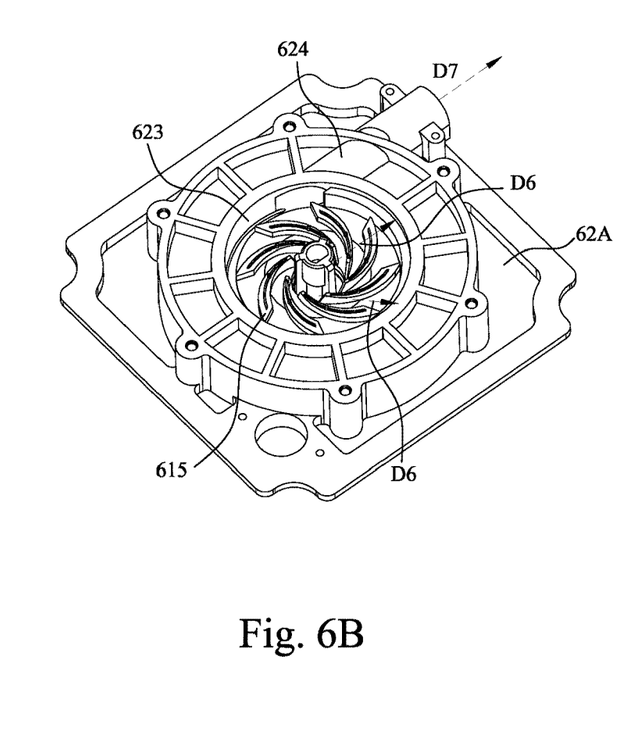

FIG. 6A and FIG. 6B are a sectional view and a three-dimensional partial view of a liquid cooling head device 6 (merely including the upper cover 62 and a part of fan blade 615), which separately show the process of the working fluid finally discharged from the liquid cooling head device 6 by the fan blade 615 after flowing into the third chamber. As shown in FIG. 6A to FIG. 6B, after the working fluid flows into the third chamber 66A from the below of the piercing hole 622 of the upper cover 62, the working fluid can be sucked into the space between the blades of the fan blade 615 in the upper recess 623 in the direction D6. When the working fluid is drawn to the vicinity of the outlet portion 624 by the rotation of the fan blade 615, the working fluid can pass through the outlet portion 624 and be thrown out of the liquid cooling head device 6 in the direction D7, so as to be sent to other cooling devices such as water cooling rows for cooling.

Thus, through the construction of the embodiments above, In addition to achieving good heat dissipation efficiency, the present disclosure is also beneficial to be applied to related computer equipment, host or server equipment.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A liquid cooling head device, comprising:
   a base comprising a diversion channel, a first chamber and at least one opening, wherein the first chamber is in communication with the diversion channel and the at least one opening;
   a heat-dissipation fin module received within the first chamber;
   an upper cover covering one surface of the base, and a second chamber formed between the upper cover and the base, and being in communication with the first chamber through the at least one opening;
   an inlet portion disposed on the base, and being in communication with the first chamber through the diversion channel;
   an outlet portion formed on the upper cover; and
   a fluid pump comprising:
      a housing covering one surface of the upper cover facing away from the base, so that a third chamber being collectively defined by the housing and the upper cover, and the third chamber respectively connected with the second chamber and the outlet portion; and
      a fan blade located in the third chamber, and the diversion channel being located between the fan blade and the first chamber,
   wherein when a working fluid is sent into the first chamber from the inlet portion, and further flowed into the second chamber, the fan blade draws the working fluid in the second chamber out of the outlet portion through the third chamber.

2. The liquid cooling head device of claim 1, wherein the base comprising:

a thermally conductive plate in which the heat-dissipation fin module is disposed one surface of the thermally conductive plate;

a lower cover assembled to the thermally conductive plate; and an elastic deflecting cover sandwiched between the thermally conductive plate and the lower cover, wherein the elastic deflecting cover comprises a first through hole and at least one second through hole, the first through hole is in communication with the diversion channel and the first chamber, and the at least one second through hole is in communication with the at least one opening and the first chamber.

3. The liquid cooling head device of claim 2, wherein the at least one opening and the at least one second through hole are two in number, and the openings are respectively aligned with, and communicated with the second through holes, and the first through hole is located between the second through holes and arranged at a central position of the lower cover.

4. The liquid cooling head device of claim 2, wherein the heat-dissipation fin module comprises a plurality of fin portions, and a slit is formed between any two adjacent ones of the fin portions; and the elastic deflecting cover comprises a flexible pad and a plurality of positioning blocks, and the positioning blocks are spaced arranged on one surface of the flexible pad facing towards the thermally conductive plate, and the positioning blocks respectively insert into the slits for fixing the elastic deflecting cover on the thermally conductive plate.

5. The liquid cooling head device of claim 4, wherein one surface of the lower cover facing away from the elastic deflecting cover is formed with a sunken portion, and the at least one opening is formed within the sunken portion, and one surface of the lower cover facing towards the elastic deflecting cover is formed with at least one annular concave portion surrounding the at least one opening.

6. The liquid cooling head device of claim 5, wherein the elastic deflecting cover further comprises at least one annular protruding portion protrusively provided on one surface of the flexible pad facing away from the thermally conductive plate, and inserting into the at least one annular concave portion.

7. The liquid cooling head device of claim 2, wherein the elastic deflecting cover includes a flexible material.

8. The liquid cooling head device of claim 1, wherein the housing comprising a machine chamber and a lower recess, the lower recess is formed on one surface of the housing, and the machine chamber is disposed in an interior of the housing; and the upper cover is formed with an upper recess, wherein the third chamber is collectively formed by the upper recess and the lower recess, and the third chamber and the machine chamber are hermetically isolated to each other.

9. The liquid cooling head device of claim 8, wherein the fluid pump further comprising:

a stator located in the machine chamber;

a rotor located in the third chamber, and fixedly connected to the fan blade;

a shaft rod passing through the rotor and the fan blade, and connected to the upper cover; and a circuit board used to drive the rotor to rotate the fan blade.

10. The liquid cooling head device of claim 9, wherein the rotor is a magnet, and the stator is one of a silicon steel sheet, a magnet and an electromagnet.

\* \* \* \* \*